(12) United States Patent
Javvaji et al.

(10) Patent No.: US 11,616,141 B2
(45) Date of Patent: Mar. 28, 2023

(54) CURRENT REFERENCE

(71) Applicant: TEXAS INSTRUMENTS INCORPORATED, Dallas, TX (US)

(72) Inventors: Sundeep Lakshmana Javvaji, Addanki (IN); Shalakha Singhal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 34 days.

(21) Appl. No.: 17/322,745

(22) Filed: May 17, 2021

(65) Prior Publication Data
US 2021/0408281 A1 Dec. 30, 2021

(30) Foreign Application Priority Data
Jun. 24, 2020 (IN) .............................. 202041026717

(51) Int. Cl.
*H01L 29/78* (2006.01)
*H01L 29/808* (2006.01)
*G05F 3/24* (2006.01)

(52) U.S. Cl.
CPC .......... *H01L 29/7832* (2013.01); *G05F 3/245* (2013.01); *H01L 29/8086* (2013.01)

(58) Field of Classification Search
CPC ............. H01L 29/7832; H01L 29/8086; H01L 27/0617; G05F 3/245; G05F 3/16; G05F 3/242; H03K 17/00
See application file for complete search history.

(56) References Cited

U.S. PATENT DOCUMENTS

| | | | | |
|---|---|---|---|---|
| 4,970,415 A | * | 11/1990 | Fitzpatrick | G05F 3/245 323/907 |
| 6,831,504 B1 | * | 12/2004 | Holloway | G05F 3/245 327/543 |
| 10,469,073 B1 | * | 11/2019 | Ozalevli | H02M 3/156 |
| 2017/0126120 A1 | * | 5/2017 | Chakraborty | H02M 3/158 |

* cited by examiner

*Primary Examiner* — John W Poos
*Assistant Examiner* — Tyler J Pereny
(74) *Attorney, Agent, or Firm* — Ray A. King; Frank D. Cimino

(57) ABSTRACT

In an example, an integrated circuit includes a junction-gate field effect transistor (JFET), a current generator, a dynamic filter, and an output transistor. The JFET has a JFET gate, a JFET source, and a JFET drain, the JFET drain adapted to be coupled to a power supply. The current generator has a current generator input and current generator outputs, the current generator input coupled to the JFET source and a first of the current generator outputs coupled to the JFET gate. The dynamic filter has a dynamic filter input and a dynamic filter output, the dynamic filter input coupled to a second of the current generator outputs. The output transistor has an output transistor gate coupled to the dynamic filter output.

15 Claims, 2 Drawing Sheets

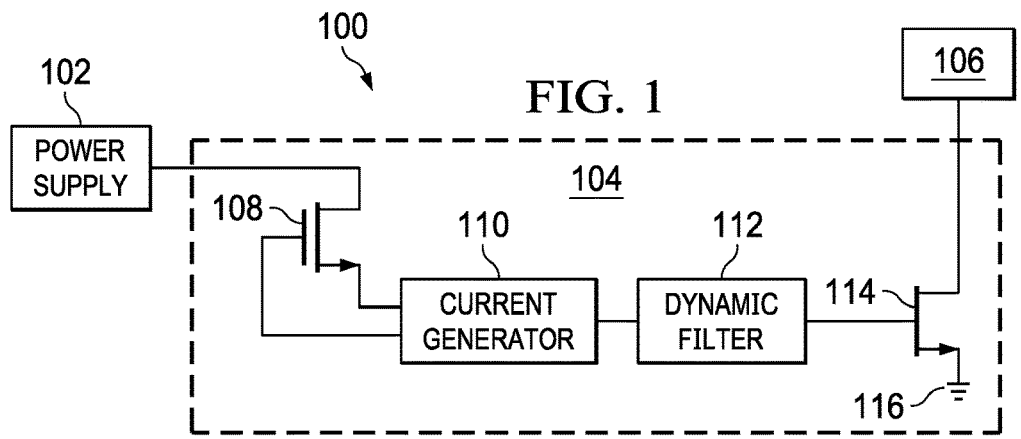
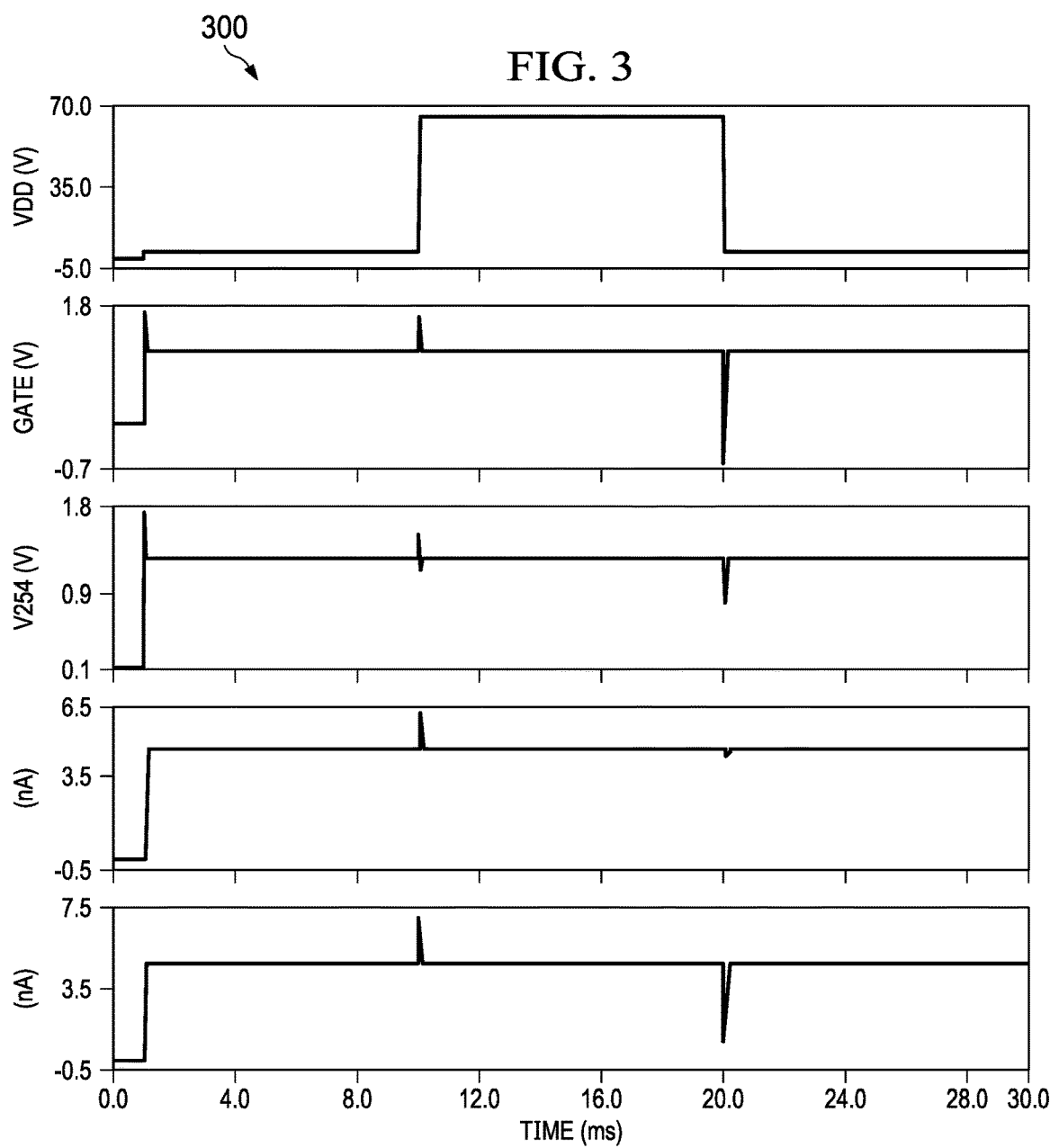

CURRENT REFERENCE

CROSS-REFERENCE TO RELATED APPLICATIONS

This application claims priority to India Provisional Patent Application No. 202041026717, which was filed Jun. 24, 2020, which is hereby incorporated herein by reference in its entirety.

BACKGROUND

A current reference is a circuit, component, or device that provides a stable current signal. For example, a current reference circuit may provide a reference current to a second component to bias the second component or otherwise aid in operation of the second component. In a given device architecture, many different current references may be implemented.

SUMMARY

In an example, an integrated circuit includes a junction-gate field effect transistor (JFET), a current generator, a dynamic filter, and an output transistor. The JFET has a JFET gate, a JFET source, and a JFET drain, the JFET drain adapted to be coupled to a power supply. The current generator has a current generator input and current generator outputs, the current generator input coupled to the JFET source and a first of the current generator outputs coupled to the JFET gate. The dynamic filter has a dynamic filter input and a dynamic filter output, the dynamic filter input coupled to a second of the current generator outputs. The output transistor has an output transistor gate coupled to the dynamic filter output.

In an example, an apparatus includes a power input, a JFET, a current generator, a dynamic filter, and an output transistor. The JFET has a JFET gate, a JFET source, and a JFET drain, the JFET drain coupled to the power input. The current generator has a current generator input and current generator outputs, the current generator input coupled to the JFET source and a first of the current generator outputs coupled to the JFET gate, the current generator configured to generate a reference current (IREF). The dynamic filter has a dynamic filter input and a dynamic filter output, the dynamic filter input coupled to a second of the current generator outputs and configured to receive a mirrored version of IREF, the dynamic filter configured to provide an output current (IOUT) based on the mirrored version of IREF. The output transistor has a gate coupled to the dynamic filter output and a drain at which the output transistor is configured to provide IOUT.

In an example, a system includes a battery, an integrated circuit including a current reference, and a circuit. The current reference has an input coupled to the battery and an output. The current reference includes a JFET, a current generator, a dynamic filter, and an output transistor. The JFET has a JFET gate, a JFET source, and a JFET drain, the JFET drain adapted to be coupled to the battery. The current generator has a current generator input and current generator outputs, the current generator input coupled to the JFET source and a first of the current generator outputs coupled to the JFET source, the current generator configured to provide IREF. The dynamic filter has a dynamic filter input and a dynamic filter output, the dynamic filter input coupled to a second of the current generator outputs and configured to receive a mirrored version of IREF, the dynamic filter configured to provide IOUT based on the mirrored version of IREF. The output transistor has a gate and a drain, the output transistor gate coupled to the dynamic filter output and a drain. The circuit has an input coupled to the output transistor drain, the circuit configured to receive IOUT from the output transistor at the circuit input.

BRIEF DESCRIPTION OF THE DRAWINGS

FIG. 1 is a block diagram of an example system.
FIG. 3 is a diagram of example waveforms.

DETAILED DESCRIPTION

Figure 2:
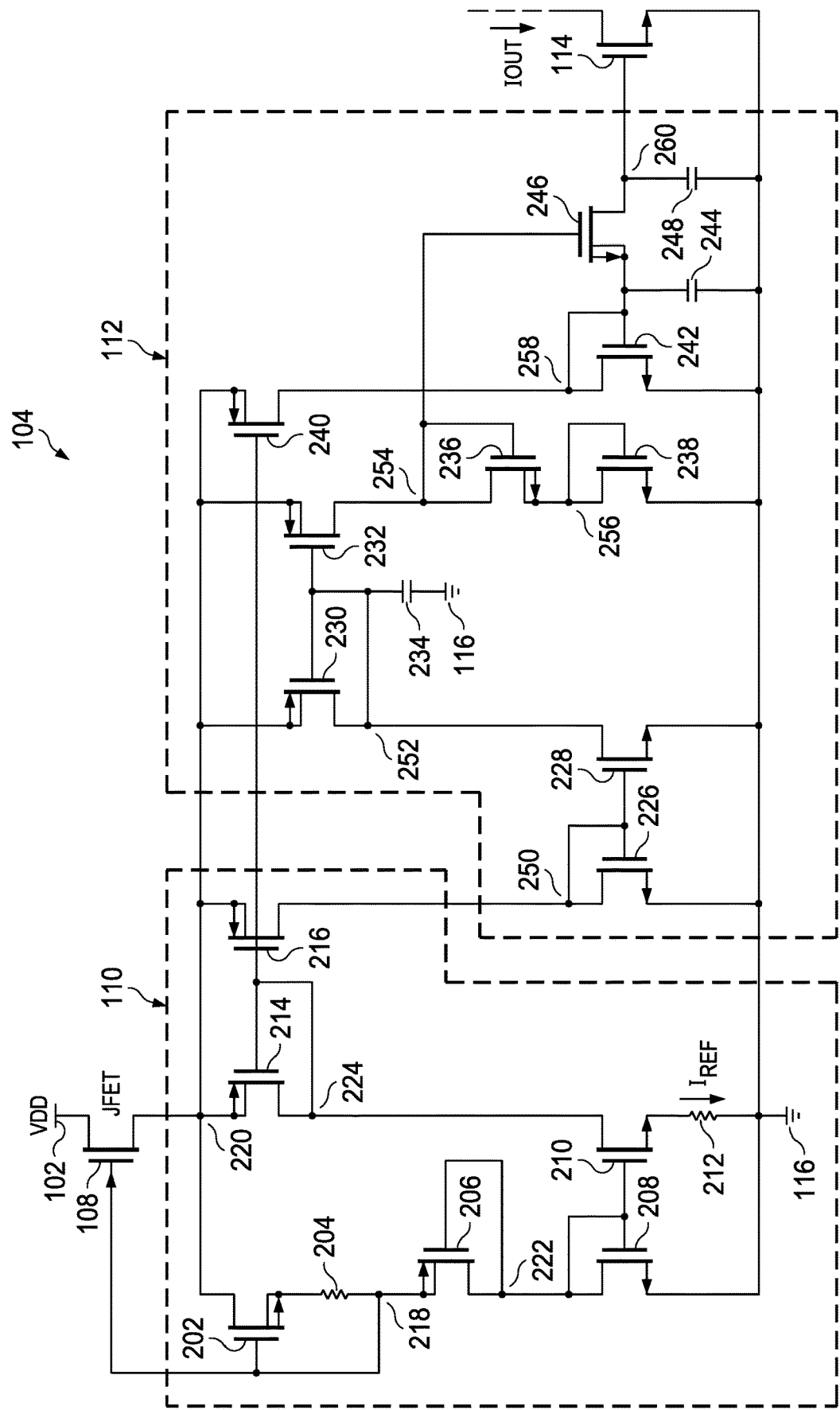
FIG. 2 is a schematic diagram of an example current reference.

As described above, a current reference may provide a reference current (IREF) to other components. For example, based on a supply voltage (VDD) received by the current reference, the current reference may generate IREF and provide IREF to one or more other components to facilitate operation of those other components. Transients in VDD can sometimes affect operation of the current reference. In some current references, a rapid fall in value of VDD (e.g., such as a decrease in value of about 1 volt (V) per microsecond (us) (V/us) or greater) can cause a value of IREF to drop in value to approximately zero, potentially having a detrimental affect on operation of other components which receive IREF. Some approaches for modifying the current reference may partially mitigate the risk of IREF dropping in value to approximately zero, but may introduce additional challenges themselves. For example, the current reference may be constructed of high-voltage components. However, high-voltage components may have a larger physical size (and therefore larger relative cost) and lower efficiency than low-voltage components. In another example, a de-coupling capacitor may be implemented. However, the de-coupling capacitor may also be relatively large in physical size and may also slow a response time of the current reference. This may render the current reference unsuitable, or less than ideal, for implementation in certain environments, such as those in which the current reference provides IREF to another component to startup operation of a circuit or device.

This description includes examples of a current reference that may be suitable for implementation across a wide range of values of VDD while having a low quiescent current (e.g., such as less than about 100 nanoamps, in a range of tens of nanoamps). In some examples, the current reference is configured to mitigate rapid falling transients in VDD through a dynamic filter that momentarily de-couples an output transistor of the current reference from VDD, mitigating an amount of decrease in the value of IREF that is translated to an output current (IOUT) provided by the dynamic filter. The current reference may further be a self-starting circuit such that the current reference does not rely on receiving a bias or other current from another circuit (other than a power supply that provides VDD) to initiate operation of the current reference. In at least some examples, the current reference is configured to start up and provide IOUT at a programmed value in fewer than about 100 microseconds.

FIG. 1 is a block diagram of an example system 100. In at least one implementation, the system 100 includes a power supply 102, a current reference 104 and a circuit 106. The current reference 104 may include a transistor 108, current generator 110, a dynamic filter 112, and a transistor 114. In at least some examples, the system 100 is representative of a transportation vehicle in which the power supply 102 is a battery of the transportation vehicle and the circuit 106 is any component of the transportation vehicle that operates at least partially according to a current received from another component, such as IOUT received from the current reference 104. In some implementations, the transistor 108 is a junction-gate field effect transistor (FET) (JFET). The transistor 108 may further be a depletion mode device.

In an example architecture of the system 100, the transistor 108 has a drain adapted to be coupled to the power supply 102 to receive VDD, a gate coupled to the current generator 110, and a source coupled to the current generator 110. The current generator 110 has an output configured to provide IREF and coupled to an input of the dynamic filter 112. The dynamic filter 112 has an output coupled to a gate of the transistor 114. The transistor 114 further has a source adapted to be coupled to ground 116 and a drain adapted to be coupled to an input of the circuit 106 to provide IOUT to the circuit 106. While the system 100 shows the transistor 108 as a component separate from the current generator 110, in at least some implementations the transistor 108 is instead a component of the current generator 110. Similarly, while the system 100 shows the transistor 114 as a component separate from the dynamic filter 112, in at least some implementations the transistor 114 is instead a component of the dynamic filter 112.

In an example of operation of the system 100, the power supply 102 provides VDD to the transistor 108. In at least some examples, the power supply 102 may be susceptible to voltage transients such that VDD may range in value from about 2.5 V to about 70 V. In other examples, other ranges of VDD are possible such that a lower bound of VDD is greater than or less than about 2.5 V and an upper bound of VDD is greater than or less than about 70 V. To accommodate the wide range in possible values of VDD, the transistor 108 may be a high-voltage device capable of operating across a full range (or majority of a range) of the possible values of VDD. In at least some examples, the transistor 108 is coupled in a cascode arrangement such that the current generator 110 is configured to bias the gate of the transistor 108 with a signal having a value sufficient to cause the transistor 108 to operate in a saturation region of operation. The cascode nature of the transistor 108, in at least some examples, enables the current reference 104 to utilize low-voltage components (e.g., such as transistors with about 5 V gate oxide values), reducing a relative size and cost of the current reference 104. While operating in the saturation region of operation, the transistor 108 may provide a signal at its source terminal having a value approximately equal to a value of the signal received at the gate of the transistor 108 plus a pinch-off voltage associated with the transistor 108. In at least some examples, the pinch-off voltage associated with the transistor 108 has a value of about 2.15 V to about 4.15 V. In other examples, other values for the pinch-off voltage associated with the transistor 108 may be possible, such as based on a doping concentration of the transistor 108. The signal provided by the transistor 108 at its source may be independent of a value of a signal received by the transistor 108 at its drain (e.g., VDD). For example, if a drain-to-source voltage of the transistor 108 is greater than the pinch-off voltage of the transistor 108, the signal provided by the transistor 108 at its source may have a value determined as a sum of the pinch-off voltage of the transistor 108 and a value of the signal received by the transistor 108 at its gate. If a drain-to-source voltage of the transistor 108 is less than the pinch-off voltage of the transistor 108, the signal provided by the transistor 108 at its source may have a value determined as a function of values of signals received by the transistor 108 at its drain and gate (e.g., an Ohmic region of operation of the transistor 108).

Based on the signal provided at the source of the transistor 108, the current generator 110 may generate IREF. In some examples, the current generator 110 provides IREF via one or more current mirrors (not shown) and one or more impedance elements (not shown), values of which may determine a value of IREF. In at least some examples, the dynamic filter 112 receives IREF from the current generator 110 and, based on IREF, controls the transistor 114 to provide IOUT. Responsive to IREF decreasing in value, such as resulting from a rapid decrease in value of VDD, as described above, the dynamic filter 112 may effectively (although not mechanically) de-couple the gate of the transistor 114 from the current generator 110 (e.g., such that IREF is not provided at the gate of the transistor 114). For example, responsive to the decrease in value of IREF, an impedance of an element (not shown) of the dynamic filter 112 may increase, effectively, and momentarily, inhibiting the transistor 114 from receiving a bias voltage corresponding to IREF at its gate. In some examples, a capacitor (not shown) coupled in parallel with the gate and the source of the transistor 114 may hold the bias voltage at the gate of the transistor 114 to maintain a value of IOUT while the gate of the transistor 114 is inhibited from receiving the bias voltage corresponding to IREF.

FIG. 2 is a schematic diagram of an example current reference 104. While the current reference 104 is shown as including both the current generator 110 and the dynamic filter 112, in various examples the current generator 110 may be implemented without the dynamic filter 112 and vice versa, in a current reference or in another circuit. In at least some examples, the current reference 104 may be implemented as an integrated circuit. In other examples, the current reference 104 may be implemented as multiple integrated circuits, or multiple separate components, that are coupled together to form the circuit arrangement shown in FIG. 2.

In some examples, the current generator 110 includes a native, or natural, FET 202, a resistor 204, a FET 206, a FET 208, a native, or natural, FET 210, a resistor 212, a FET 214, and a FET 216. In at least some examples, the FET 202 is implemented as a native FET to facilitate the self-startup of the current reference 104 described herein, such as resulting from a negative gate-to-source voltage (Vgs) threshold of the FET 202 for a nanoamp range bias current. Although the transistor 108 may be implemented separately from the current generator 110, for the purposes of the description of the current generator 110, the transistor 108 will be described as a component of the current generator 110. In an example architecture of the current generator 110, the transistor 108 has a drain adapted to be coupled to the power supply 102 and configured to receive VDD from the power supply 102. The transistor 108 further has a gate coupled to a node 218 and a source coupled to a node 220. The FET 202 has a drain coupled to the node 220, a gate coupled to the node 218, and a source coupled through the resistor 204 to the node 218. In at least some examples, the resistor 204 has a resistance of about 20 megaohms. In at least some examples, the resistor 204 may generally have a resistance value determined to cause about 3-4 nanoamps of current to flow through the resistor 204. The FET 206 has a source coupled to the node 218 and a drain and gate coupled to a node 222. The FET 208 has a drain and gate coupled to the node 222 and a source coupled to ground 116. In at least some examples, the FET 206 and the FET 208 are each diode-connected FETs. The FET 210 has a gate coupled to the node 222, a source coupled through the resistor 212 to ground 116, and a drain coupled to a node 224. In at least some examples, the resistor 212 has a resistance of about 14 megaohms. In some examples, a current flowing through the resistor 212 is approximately equal to IREF such that altering a value of resistance of the resistor 212 may alter a value of IREF provided by the current generator 110. In various implementations of the current reference 104, IREF has a value approximately equal to a difference of Vgs of the FET 208 and Vgs of the FET 210, with that difference being divided by the resistance of the resistor 212 to provide the value of IREF. In at least some examples, the FET 208 and the FET 210 together provide a voltage across the resistor 212 having a value approximately equal to a difference of a Vgs of the FET 208 and a Vgs of the FET 210. The FET 214 has a drain and a gate coupled to the node 224 and a source coupled to the node 220. The FET 216 has a gate coupled to the node 224, a source coupled to the node 220, and a drain at which IREF is provided. In at least some examples, the FET 214 and the FET 216 form a current mirror that mirrors a current (e.g., IREF) from the node 224 to the drain of the FET 216, such as to be provided by the current generator 110.

In an example of operation of the current generator 110, the FET 202 and the resistor 204 form a current source between the node 220 and the node 218, without regard to a voltage provided at the node 220. Current provided by this current source biases the FET 206 and the FET 208 to provide a signal at the node 218. The signal provided at the node 218 has a value approximately equal to a Vgs of the FET 206 plus a Vgs of the FET 208. The signal provided at the node 218 biases the transistor 108 such that a voltage at the node 220 (V220) is approximately equal to the voltage at the node 218 (V218) plus a pinch-off voltage of the transistor 108. In at least some examples, the source of the transistor 108 (which provides V218 at the node 218) may be considered a local power supply of the current generator 110. Based on the V220 being greater in value than a voltage at the node 224 (V224), the FET 214 turns on and conducts current between its drain and source. In at least some examples, a voltage at the node 222 (V222) is approximately equal to V218 minus Vgs of the FET 206. Based on V222, the FET 208 and the FET 210 turn on and conduct between their respective drain and sources. Responsive to the FET 210 turning on, the resistor 212 sinks an amount of current approximately equal to IREF from the node 220 through the FET 214, node 224, and the FET 210. The FET 214 and the FET 216 mirror the current flowing through the node 224 to the drain of the FET 216 to be provided by the current generator 110 as IREF.

In some implementations, the dynamic filter 112 is coupled to the drain of the FET 216 and is configured to receive IREF, as described above. In some examples, the dynamic filter 112 includes a FET 226, a FET 228, a FET 230, a FET 232, a capacitor 234, a FET 236, a FET 238, a FET 240, a FET 242, a capacitor 244, a FET 246, and a capacitor 248. Although the transistor 114 may be implemented separately from the dynamic filter 112, for the purposes of the description of the dynamic filter 112, the transistor 114 will be described as a component of the dynamic filter 112. In an example architecture of the dynamic filter 112, the FET 236 has a drain and gate coupled to a node 250 and a source coupled to ground 116. In at least some examples, the node 250 is adapted to be coupled to the drain of the FET 216 of the current generator 110 such that IREF is provided at the node 250. In other examples, the node 250 is an input node of the dynamic filter 112 at which a signal to be filtered is received by the dynamic filter 112. The FET 228 has a gate coupled to the node 250, a source coupled to ground 116, and a drain coupled to a node 252. In at least some examples, the FET 226 and the FET 228 together form a current mirror that mirrors a current (e.g., such as IREF) from the node 250 to the node 252.

The FET 230 has a gate and a drain coupled to the node 252 and a source coupled to the node 220. In some examples, the source of the FET 230 is instead coupled to a power supply for the dynamic filter 112 and not necessarily the node 220 (e.g., such as in implementations in which the dynamic filter 112 is implemented independently of the current generator 110). The FET 232 has a gate coupled to the node 252, a source coupled to the node 220, and a drain coupled to a node 254. In some examples, the source of the FET 232 is instead coupled to a power supply for the dynamic filter 112 and not necessarily the node 220 (e.g., such as in implementations in which the dynamic filter 112 is implemented independently of the current generator 110). In at least some examples, the FET 230 and the FET 232 together form a current mirror that mirrors a current (e.g., such as IREF) from the node 252 to the node 254. The capacitor 234 is coupled between the node 252 and ground 116. The FET 236 has a drain and gate coupled to the node 254 and a source coupled to a node 256. The FET 238 has a drain and gate coupled to the node 256 and a source coupled to ground 116. In at least some examples, the FET 236 and the FET 238 are each diode-connected FETs such that a voltage at the node 254 (V254) is approximately equal to a Vgs of the FET 236 plus a Vgs of the FET 238.

The FET 240 has a gate coupled to the node 224, a source coupled to the node 220, and a drain coupled to a node 258. In at least some examples, the FET 214 and the FET 240 together form a current mirror that mirrors a current (e.g., such as IREF) from the node 224 to the node 258. The FET 242 has a drain and gate coupled to the node 258 and a source coupled to ground 116. In some examples, the FET 242 is a diode-connected FET. The capacitor 244 is coupled between the node 258 and ground 116. The FET 246 has a source coupled to the node 258, a gate coupled to the node 254, and a drain coupled to a node 260. In at least some examples, the FET 246 is a pass device between the node 258 and the node 260. The capacitor 248 is coupled between the node 260 and ground 116. In at least some examples, the transistor 114 is adapted to be coupled at its gate to the node 260. The transistor 114 further has a source coupled to ground 116 and a drain at which IOUT is provided. In this way, the drain of the transistor 114 may be an output of the dynamic filter 112 at which IOUT is provided as an output signal of the dynamic filter 112.

In an example of operation of the dynamic filter 112, IREF (or some other signal to be filtered by the dynamic filter 112) is received at the node 250. The FET 226 and the FET 228 mirror IREF from the node 250 to the node 252 and the FET 230 and FET 232 mirror IREF from the node 252 to the node 254. The FET 236 and the FET 238 operate functionally as diodes, clamping a voltage at the node 254 (V254) to approximately Vgs of the FET 236 plus Vgs of the FET 238, as described above.

As described above, in some examples VDD may decrease in value, reducing a value of IREF to approximately zero (or some other reduced value). For example, a parasitic capacitance of the transistor 108 may couple VDD from the drain of the transistor 108 to the gate of the transistor 108. As VDD decreases in value, the value of the signal provided at the source of the transistor 108 may also decrease in value, potentially causing IREF to decrease in value, such as to about zero. However, it may be detrimental to operation of the current reference 104 and/or a circuit (e.g., such as the circuit 106) that receives IOUT from the current reference 104 to allow IOUT to fall in value to about zero responsive to IREF falling in value to about zero.

To mitigate a decrease in value of IOUT resulting from a decrease in value of IREF, the FET 246 may function as a cut-off switch in the dynamic filter 112. For example, as IREF decreases in value (e.g., such as due to transients causing a rapid decrease in value of VDD), Vgs of the FET 246 may decrease (e.g., such as resulting from a decrease in value of V254). As Vgs of the FET 246 decreases, resistance of the FET 246 increases. Responsive to the Vgs of the FET 246 decreasing to a value insufficient to cause the FET 246 to conduct between its drain and source terminals, the FET 246 may be approximated as a high-impedance element that functionally creates a break or open in the circuit architecture of the dynamic filter 112 for current flowing from the node 258 to the node 260. The high-impedance of the FET 246 effectively isolates the gate of the transistor 114 from IREF, preventing the decrease in value of IREF from affecting operation of the transistor 114 and/or providing of IOUT. To enable the transistor 114 to continue providing IOUT while temporarily isolated from IREF, the capacitor 248 may hold a voltage at the gate of the transistor 114. In at least some examples, an amount of time for which the gate of the transistor 114 is electrically isolated from IREF may be determined at least partially according to a value of capacitance of the capacitor 248. For example, the capacitor 248 may have a capacitance sufficient to hold the voltage at the gate of the transistor 114 until the transients in VDD have settled and the gate of the transistor 114 is no longer electrically isolated from IREF. The capacitor 244 may introduce a delay at the source of the FET 246 to cause a gate voltage of the FET 246 to decrease before the source voltage of the FET 246 decreases.

In at least some examples, the capacitor 234 introduces a delay at the node 252. During startup of the current reference 104, the delay introduced by the capacitor 234 may cause a current flowing through the FET 230 and the FET 232 to be greater in value than a current flowing through the FET 214 and the FET 216. The higher current flowing through the FET 230 and the FET 232 during startup of the current reference 104 increases a voltage provided at the gate of FET 246, which reduces impedance of the FET 246, decreasing an amount of time for the gate voltage of the transistor 114 to settle.

FIG. 3 is a diagram 300 of example waveforms of the current reference 104. For example, the waveforms of the diagram 300 show at least some operational circumstances of the current reference 104. The diagram 300 includes VDD, GATE (e.g., a voltage provided at the gate of the transistor 108), IREF, IOUT (e.g., as provided by the dynamic filter 112), and V254. Each signal shown in the diagram 300 is provided having a horizontal axis representative of time in units of milliseconds (ms). VDD, GATE, and V254 are each provided having a vertical axis representative of voltage in units of volts (V). IREF and IOUT are each provided having a vertical axis representative of current in units of nanoamperes (nA).

As shown by the diagram 300, responsive to a decrease in value of VDD with a slew rate of greater than about 1 V/us, GATE decreases in value. As shown by IREF, responsive to the decrease in value of GATE, IREF would also decrease in value in the absence of the dynamic filter 112. However, as further shown by the diagram 300, V254 decreases in value responsive to GATE decreasing in value. Responsive to V254 decreasing in value, the FET 214 is isolated from IREF, as described above. As shown by IOUT, isolating the FET 214 from IREF responsive to the decrease in value of GATE reduces a decrease in value of IOUT translated from the decrease in value of GATE. Reducing the decrease in value of IOUT improves performance of the current reference 104 in comparison to a current reference that does not include the dynamic filter 112 or that implements other techniques such as one or more de-coupling capacitors.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party. Various nodes and/or terminals, as well as components having terminals, inputs, and/or outputs are described herein. These various nodes, terminals, inputs, and/or outputs may be coupled together via conductors that are electrically conductive. Examples of conductors may include wires, wire bonds, traces, such as in an integrated circuit or on a printed circuit board, or other electrically conductive materials.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Current mirrors as described herein may have any ratio, such that a described current mirror may increase a current value (e.g., provide a current with an approximately 1:X ratio, X>1), decrease a current value (e.g., provide a current with an approximately X:1 ratio, X>1), or provide a current with an approximately 1:1 ratio.

Uses of the phrase "ground voltage potential" or "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described examples, and other examples are possible, within the scope of the claims.

What is claimed is:

1. An integrated circuit, comprising:
a junction-gate field effect transistor (JFET) having a JFET gate, a JFET source, and a JFET drain, the JFET drain coupled to a power supply terminal;
a current generator having first and second current generator outputs and a current generator input, wherein the current generator input is coupled to the JFET source, and the first current generator output is coupled to the JFET gate;
a dynamic filter having a dynamic filter input and a dynamic filter output, wherein the dynamic filter input is coupled to the second current generator output;
a first transistor having a first gate, a first source and a first drain, wherein the first gate is coupled to the dynamic filter output;
a second transistor having a second gate, a second source and a second drain, wherein the second gate is coupled to the JFET gate;
first and second resistors, wherein the first resistor is coupled between the second source and the JFET gate;
a third transistor having a third gate, a third source and a third drain, wherein the third gate is coupled to the third drain, and the third source is coupled to the JFET gate;
a fourth transistor having a fourth gate, a fourth source and a fourth drain, wherein the fourth gate and fourth drain are coupled to the third drain, and the fourth source is coupled to a ground terminal;
a fifth transistor having a fifth gate, a fifth source and a fifth drain, wherein the fifth gate is coupled to the fourth gate, and the fifth source is coupled to a ground terminal through the second resistor;
a sixth transistor having a sixth gate, a sixth source and a sixth drain, wherein the sixth drain is coupled to the fifth drain, and the sixth source is coupled to the JFET source; and; and
a seventh transistor having a seventh gate, a seventh source and a seventh drain, wherein the seventh gate is coupled to the sixth gate, and the seventh source is coupled to the JFET source.

2. The integrated circuit of claim 1, wherein the second transistor and the fifth transistor are native transistors.

3. The integrated circuit of claim 1, wherein the seventh drain is coupled to the second current generator output, and a reference current having a value responsive to a resistance of the second resistor is provided at the seventh drain.

4. The integrated circuit of claim 1, wherein the dynamic filter comprises:
an eighth transistor having an eighth gate, eighth source and an eighth drain, wherein the eighth drain and the eighth gate are coupled to the second current generator output, and the eighth source is coupled to the ground terminal;
a ninth transistor having a ninth gate, a ninth source and a ninth drain, wherein the ninth gate is coupled to the eighth gate, and the ninth source is coupled to the ground terminal;
a tenth transistor having a tenth gate, a tenth source and a tenth drain, wherein the tenth gate and the tenth drain are coupled to the ninth drain, and the tenth source is coupled to the JFET source;
an eleventh transistor having an eleventh gate, an eleventh source and an eleventh drain, wherein the eleventh gate is coupled to the tenth gate, and the eleventh source is coupled to the JFET source;
a twelfth transistor having a twelfth gate, a twelfth source and a twelfth drain, wherein the twelfth gate and the twelfth drain are coupled to the eleventh drain;
a thirteenth transistor having a thirteenth gate, a thirteenth source and a thirteenth drain, wherein the thirteenth gate and the thirteenth drain are coupled to the twelfth source, and the thirteenth source coupled to the ground terminal;
a fourteenth transistor having a fourteenth gate, a fourteenth source and a fourteenth drain, wherein the fourteenth gate is coupled to the current generator, and the fourteenth source is coupled to the JFET source;
a fifteenth transistor having a fifteenth gate, a fifteenth source and a fifteenth drain, wherein the fifteenth gate and the fifteenth drain are coupled to the fourteenth drain, and the fifteenth source is coupled to the ground terminal; and
a sixteenth transistor having a sixteenth gate, a sixteenth source and a sixteenth drain, wherein the sixteenth gate is coupled to the twelfth gate, and the sixteenth source is coupled to the fifteenth gate, and the sixteenth drain is coupled to the first gate.

5. The integrated circuit of claim 4, wherein the dynamic filter includes:
a first capacitor coupled between the tenth gate and the ground terminal
a second capacitor coupled between the fifteenth gate and the ground terminal; and
a third capacitor coupled between the sixteenth drain and the ground terminal.

6. The integrated circuit of claim 4, wherein the first transistor is configured to provide a current at the first drain responsive to a value of a current at the seventh drain.

7. An apparatus, comprising:
a junction-gate field effect transistor (JFET) having a JFET gate, a JFET source, and a JFET drain, wherein the JFET drain is coupled to a power input, and the JFET is configured to provide a local power supply at the JFET source, the local power supply having a value approximately equal to a voltage at the JFET gate plus a pinch-off voltage of the JFET;
a current generator having a current generator input and first and second current generator outputs, wherein the current generator input is coupled to the JFET source, the first current generator output is coupled to the JFET gate, and the current generator is configured to provide a reference current (IREF);
a dynamic filter having a dynamic filter input and a dynamic filter output, wherein the dynamic filter input is coupled to the second current generator output and configured to receive a mirrored version of IREF, the dynamic filter configured to provide an output current (IOUT) at the dynamic filter output responsive to the mirrored version of IREF; and an output transistor having an output gate, an output source and an output drain, wherein the output gate is coupled to the dynamic filter output, and the output transistor is configured to provide IOUT at the output drain;

wherein the dynamic filter includes a pass transistor configured to provide a second mirrored version of IREF to the output gate.

8. The apparatus of claim 7, wherein the value of IREF is proportional to the local power supply and inversely proportional to a resistance of a resistor.

9. The apparatus of claim 7, wherein the pass transistor is configured to electrically isolate the output gate from the second mirrored version of IREF responsive to a decrease in value of the local power supply exceeding a threshold slew rate.

10. The apparatus of claim 9, wherein electrically isolating the output gate from the second mirrored version of IREF mitigates translation of a decrease in value in IREF to IOUT, resulting from the decrease in value of the local power supply.

11. The apparatus of claim 7, wherein the current generator is a self-starting circuit configured to provide a bias current to the JFET gate.

12. A system, comprising:
   an integrated circuit comprising a current reference having an input coupled to a battery and an output, the current reference comprising:
      a junction-gate field effect transistor (JFET) having a JFET gate, a JFET source, and a JFET drain, wherein the JFET drain is coupled to the battery, and the JFET is configured to provide a local power supply at the JFET source, the local power supply having a value approximately equal to a voltage at the JFET gate plus a pinch-off voltage of the JFET, the voltage being independent of a voltage of the battery;
      a current generator having a current generator input and first and second current generator outputs, wherein the current generator input is coupled to the JFET source, the first current generator output is coupled to the JFET source, and the current generator is configured to provide a reference current (IREF) that is responsive to the local power supply and a resistor having a resistance that is inversely proportional to IREF;
      a dynamic filter having a dynamic filter input and a dynamic filter output, wherein the dynamic filter input is coupled to the second current generator output and is configured to receive a mirrored version of IREF, the dynamic filter is configured to provide an output current (TOUT) responsive to the mirrored version of IREF, and the dynamic filter includes a pass transistor; and
      an output transistor having an output gate, an output source and an output drain, wherein the output gate is coupled to the dynamic filter output and the pass transistor, and the pass transistor provides a second mirrored version of IREF to the output gate; and
   a circuit having a circuit input coupled to the output drain.

13. The system of claim 12, wherein the battery has voltage transients resulting in a battery voltage in a range of about 2.5 volts to about 70 volts.

14. The system of claim 12, wherein the pass transistor is configured to electrically isolate the output gate from the second mirrored version of IREF responsive to a decrease in value of the local power supply exceeding a threshold slew rate.

15. The system of claim 14, wherein electrically isolating the output gate from the second mirrored version of IREF mitigates translation of a decrease in value in IREF to IOUT, resulting from the decrease in value of the local power supply.

* * * * *